(12) United States Patent
Batara et al.

(10) Patent No.: US 7,199,599 B2
(45) Date of Patent: Apr. 3, 2007

(54) INTEGRATED CIRCUIT SOCKET WITH REMOVABLE SUPPORT

(75) Inventors: Walter Jay Batara, Manila (PH); Kok Wei (Harrick) Lam, Penang (MY)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 10/959,620

(22) Filed: Oct. 6, 2004

(65) Prior Publication Data

US 2006/0089013 A1 Apr. 27, 2006

(51) Int. Cl.
*G01R 31/02* (2006.01)

(52) U.S. Cl. ............................ 324/765; 324/755

(58) Field of Classification Search ............ None
See application file for complete search history.

(56) References Cited

U.S. PATENT DOCUMENTS 5,727,954 A * 3/1998 Kato et al. .................. 439/66
5,907,246 A * 5/1999 Abraham et al. ........... 324/760
6,541,991 B1 * 4/2003 Hornchek et al. .......... 324/755
6,776,624 B2 * 8/2004 Suematsu .................... 439/71
2005/0225315 A1 * 10/2005 Goldsmith et al. ....... 324/158.1

* cited by examiner

*Primary Examiner*—Minh N. Tang
(74) *Attorney, Agent, or Firm*—Buckley, Maschoff & Talwalkar LLC

(57) ABSTRACT

An apparatus may include a body to couple to a motherboard, the body defining an opening, and a support removably coupled to the body, the support to mount in the opening and to pass electrical interconnects to electrically couple an integrated circuit to the motherboard. In further aspects, an apparatus may include a plurality of electrical interconnects disposed in respective ones of a plurality of openings of the support, the plurality of electrical interconnects to electrically couple an integrated circuit to the motherboard, a base mounted on the body, the base defining base openings to pass the plurality of electrical interconnects, wherein the base is to receive the integrated circuit and to move toward the support so as the bring electrical contacts of the integrated circuit into contact with the plurality of electrical interconnects.

15 Claims, 5 Drawing Sheets

INTEGRATED CIRCUIT SOCKET WITH REMOVABLE SUPPORT

BACKGROUND

A computer processing platform typically consists of a motherboard, a microprocessor coupled to the motherboard, and various other elements such as a power supply, peripheral controllers, and memory controllers that are also connected to the motherboard. The microprocessor and the other elements may be electrically coupled to one another via electrical traces formed on and/or within the motherboard.

A microprocessor may be tested to confirm that it operates properly with a computer processing platform in which the microprocessor is intended to be used. The testing may verify functionality of the microprocessor in response to received commands and to various states of the other elements coupled to the motherboard. The microprocessor may also be subjected to high electrostatic discharge, temperature, and/or vibration to see if it is capable of proper functioning within its environmental specifications. Some testing devices consist of a computer processing platform that allows a microprocessor to be placed thereon, tested, and removed, and allows other microprocessors to be successively placed thereon, tested, and removed.

DETAILED DESCRIPTION

Figure 1:
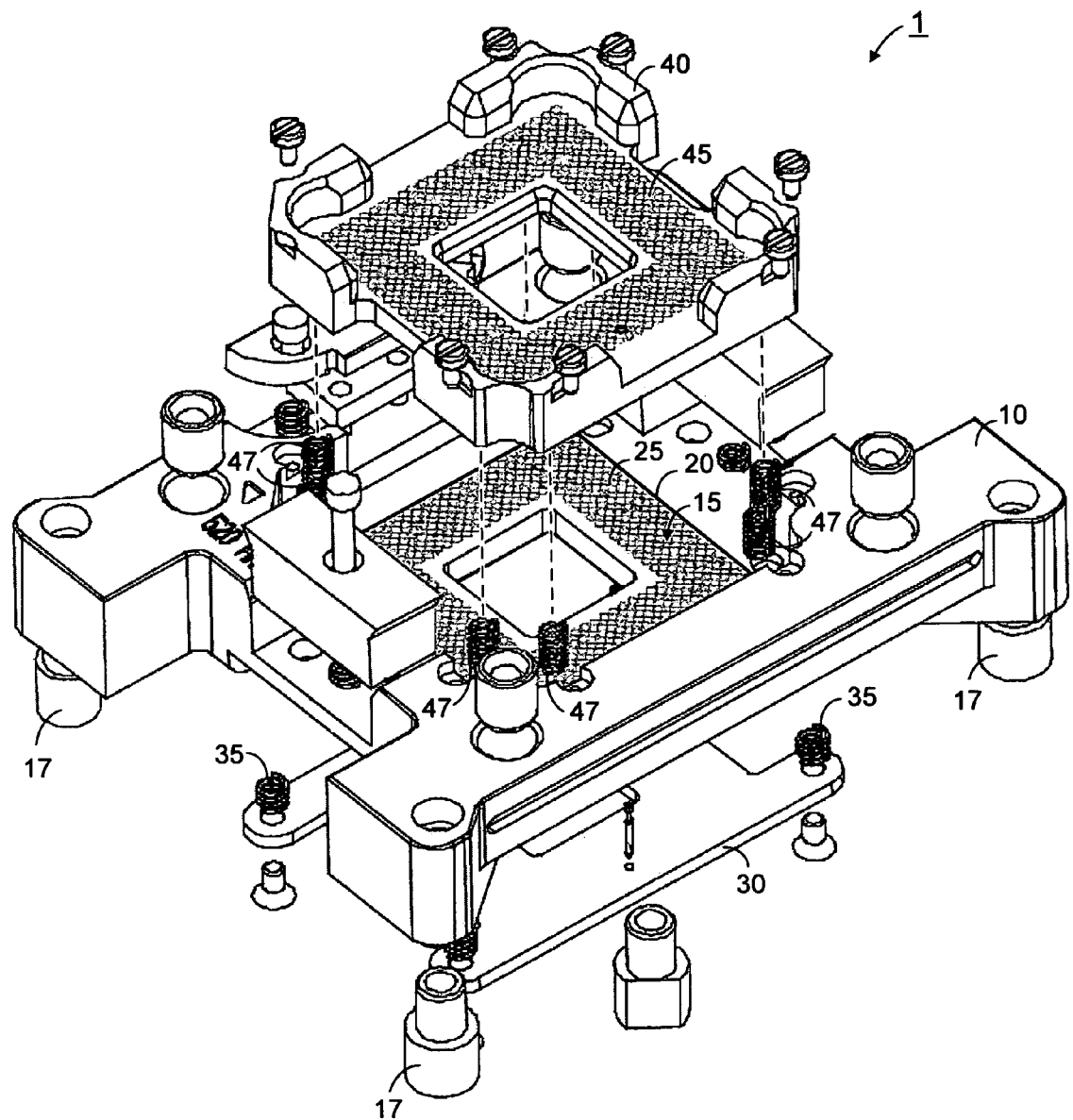
FIG. 1 is an exploded view of an apparatus according to some embodiments.

FIG. 1 is an exploded view of an apparatus according to some embodiments. Contactor 1 may receive an integrated circuit and be coupled to a motherboard to test the operation of the integrated circuit under various conditions. Contactor 1 comprises body 10, support 20, insert 30, and base 40. Elements 10 through 40 may be primarily composed of a suitable durable, electrostatic discharge-resistant, and temperature-resistant material as is or will be known in the art. Non-exhaustive examples include Orlon, Ultem, and PEEK-based materials.

Body 10 defines rectangular opening 15, in which support 20 is mounted. Support 20 may rest on ledges (not shown) of body 10 extending into opening 15. Support 20 may be separate from body 10, and may define openings 25 to pass electrical interconnects (not shown). According to some embodiments, support 20 may be removed from body 10 and replaced with a new instantiation of support 20. Such replacement may be desired if one or more of openings 25 is damaged during testing of an integrated circuit received by contactor 1.

Figure 2:
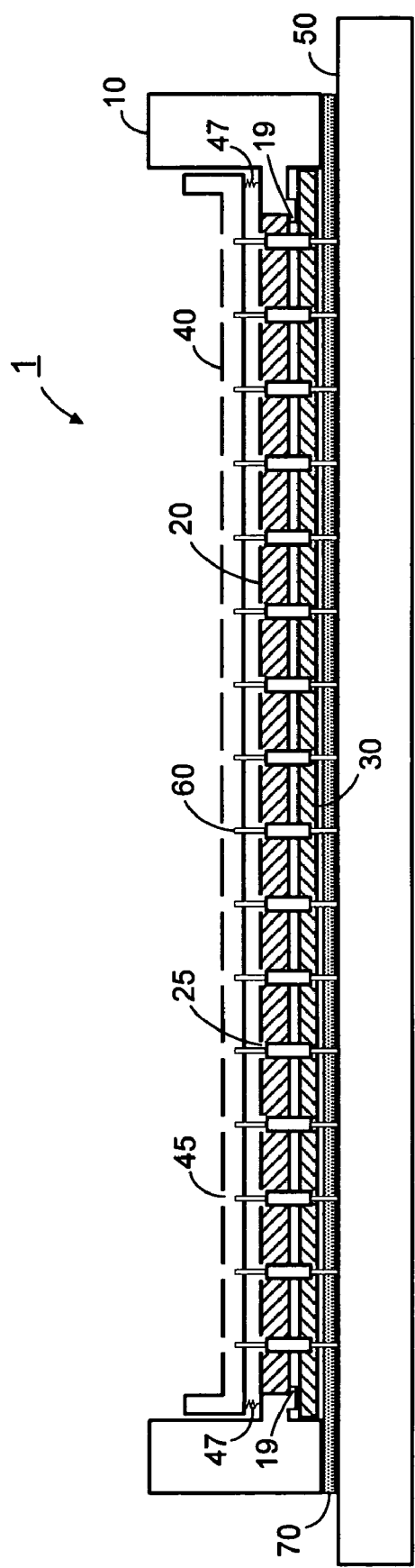
FIG. 2 is a cross-sectional side view of an apparatus according to some embodiments.
Figure 3:
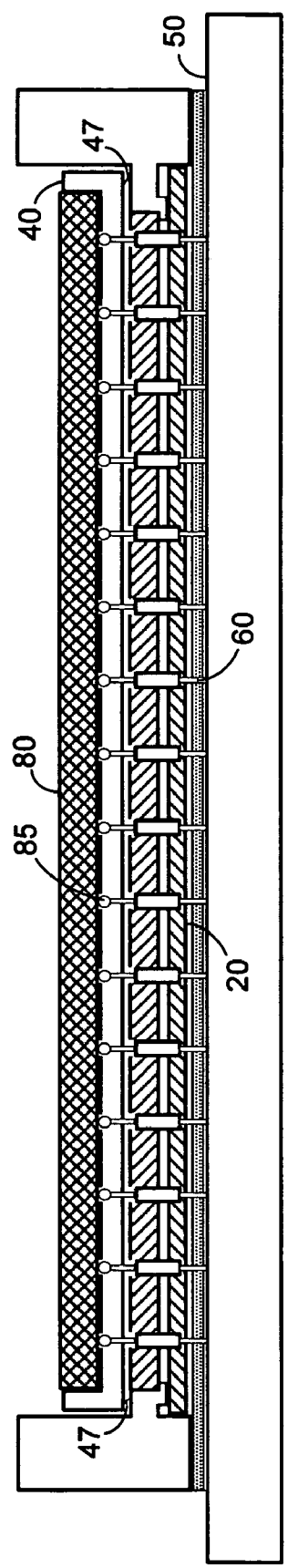
FIG. 3 is a cross-sectional side view of an apparatus and an integrated circuit under test according to some embodiments.

The above-mentioned electrical interconnects, embodiments of which are illustrated in FIGS. 2 and 3, may electrically couple an integrated circuit received by contactor 1 to a motherboard to which contactor 1 is coupled. In this regard, body 10 includes connectors 17 to couple body 10 to corresponding structures of a motherboard. Any type of suitable connectors may be used in conjunction with some embodiments.

Insert 30 may be coupled to body 10 beneath support 20. Insert 30 may define openings through which the above-mentioned electrical interconnects may pass. The defined openings of insert 30 may allow only a portion of each electrical interconnect to pass therethrough, thereby maintaining the electrical interconnects within respective openings 25 of support 20. Springs 35 may be disposed between insert 30 and body 10 to allow resisted movement of insert 30 away from body 10.

Base 40 defines base openings 45 for allowing the above-mentioned electrical interconnects to pass therethrough. Base 40 may receive an integrated circuit (not shown) such that one or more electrical contacts of the integrated circuit are positioned over one or more respective ones of base openings 45. Springs 47 are disposed between base 40 and body 10 to allow resisted movement of base 40 towards body 10. Such movement may bring the electrical contacts of the integrated circuit into contact with one or more electrical interconnects passing through base openings 45.

FIG. 2 is a cross-sectional side view of contactor 1 according to some embodiments. Contactor 1 of FIG. 2 is shown coupled to motherboard 50. Motherboard 50 may comprise any suitable material, such as FR4 material, and may be dedicated to platform validation testing. Accordingly, elements other than contactor 1 may also be coupled to motherboard 50. Some of such elements according to some embodiments will be described below with respect to FIG. 5.

FIG. 2 also illustrates electrical interconnects 60. Electrical interconnects 60 pass through respective ones of openings 25 of support 20, base openings 45 of base 40, and openings of insert 30. Base 40 is suspended above support 20 by springs 47, and electrical interconnects 60 therefore do not pass fully through openings 45. In the illustrated embodiment, a width of the openings of insert 30 at a bottom surface of insert 30 is less than a width of a portion of electrical interconnects 60. This arrangement may allow insert 30 to maintain electrical interconnects 60 within respective openings 25 of support 20. However, narrower portions of electrical interconnects 60 may pass through the openings of insert 30 and touch respective electrical contacts of motherboard 50.

Electrical interconnects 60 may comprise any one or more devices that provide an electrical connection between two elements that are in contact with different surfaces of interconnects 60. According to some embodiments, electrical interconnects 60 comprise elements, such as pogo pins, that compress when end-to-end pressure is applied.

Support 20 is removably seated on ledges 19 of body 10. Support 20 and insert 30 are depicted with fill patterns to distinguish themselves from surrounding elements of FIG. 2, rather than to illustrate any relative material composition. Similarly, interposer 70 is illustrated with a fill pattern that has no necessary relation to the composition of interposer 70. According to some embodiments, interposer 70 is disposed between body 10 and motherboard 50. Interposer 70 may therefore include or pass elements for coupling body to motherboard 50.

FIG. 3 is a cross-sectional side view of contactor 1 of FIG. 2 after receiving integrated circuit (IC) 80 according to some embodiments. Integrated circuit 80 may comprise may comprise any IC, including but not limited to a microprocessor, a network processor, a controller hub, and a chipset.

Integrated circuit 80 may comprise an integrated circuit die disposed within an integrated circuit package. The integrated circuit die may include electrical devices integrated therein, and the integrated circuit package may comprise any ceramic, organic, and/or other suitable material including an electrical interface that is compatible with the arrangement of base openings 45 and electrical contacts 60. According to some embodiments, integrated circuit 80 comprises an Organic Land Grid Array (OLGA) package including solder balls 85 that are in a Land Grid Array configuration and are electrically coupled to electrical devices of integrated circuit 80. Alternative integrated circuit types and packaging may be used in conjunction with some embodiments.

The weight of integrated circuit 80 and/or other pressure applied to base 40 results in the compression of springs 47 and movement of base 40 towards support 20. As shown in FIG. 3, this movement brings solder balls 85 into contact with respective ones of electrical interconnects 60. Accordingly, solder balls 85 become electrically coupled to electrical contacts of motherboard 50.

Figure 4:
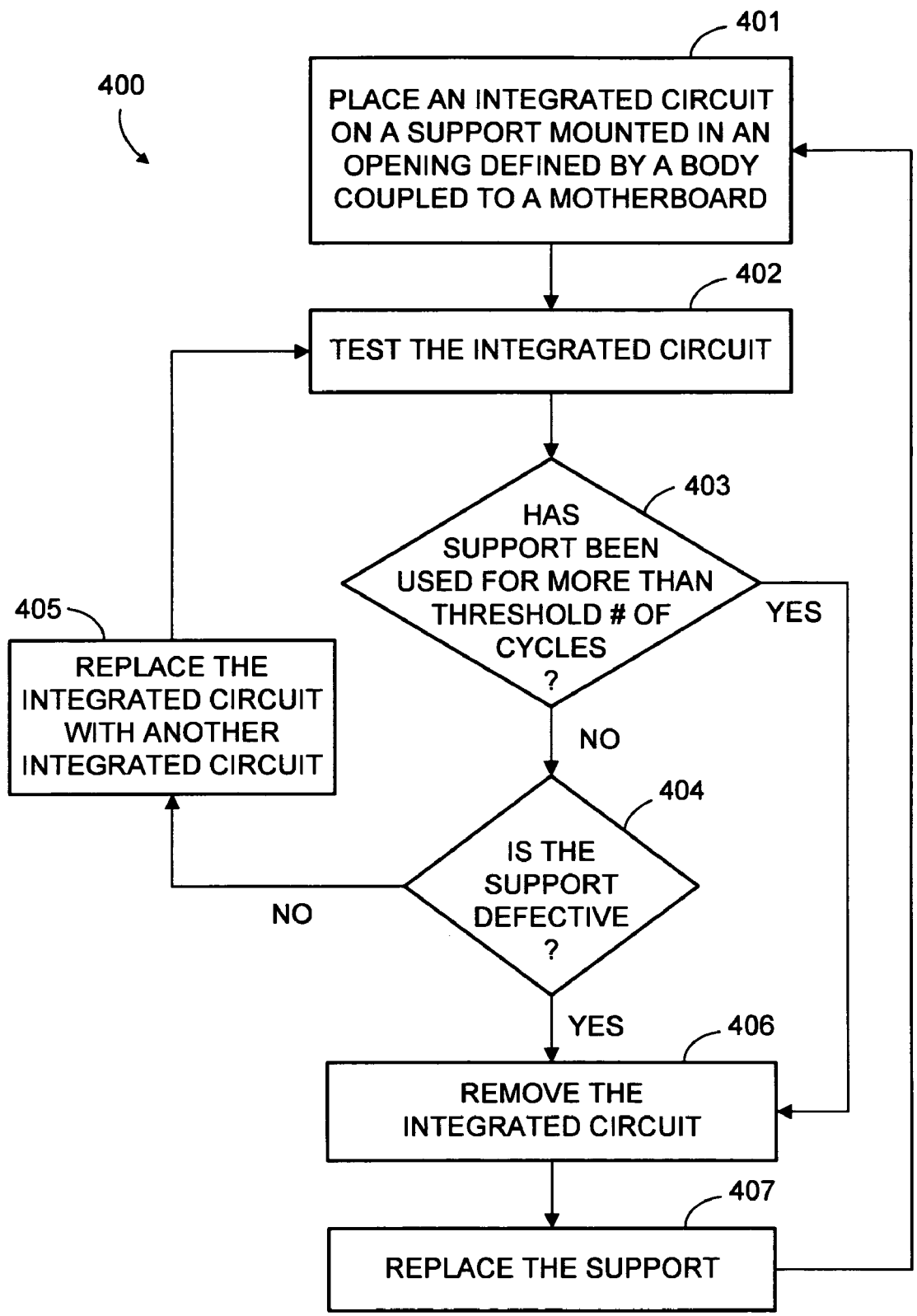
FIG. 4 is a flow diagram of a method according to some embodiments.

FIG. 4 is a flow diagram of process 400. Process 400 may be used to test multiple ICs according to some embodiments. In some embodiments, process 400 may be used to validate microprocessor platform performance in a high-volume manufacturing environment. Process 400 may be executed by hardware, by software, and/or manually.

Initially, at 401, an integrated circuit is placed on a support that is mounted in an opening. The opening, in turn, is defined by a body coupled to a motherboard. For example, 401 may comprise placing integrated circuit 80 on contactor 1 as shown in FIG. 2, resulting in the arrangement illustrated in FIG. 3. Integrated circuit 80 may be placed indirectly on support 20 as shown in FIG. 3 according to some embodiments of 401. According to other embodiments, an integrated circuit is placed in direct contact with a support.

The integrated circuit is tested at 402. Testing may involve any currently- or hereafter-known testing methods and hardware. According to some embodiments, testing at 402 comprises performing processor platform validation using a testing platform that is based on motherboard 50.

Figure 5:
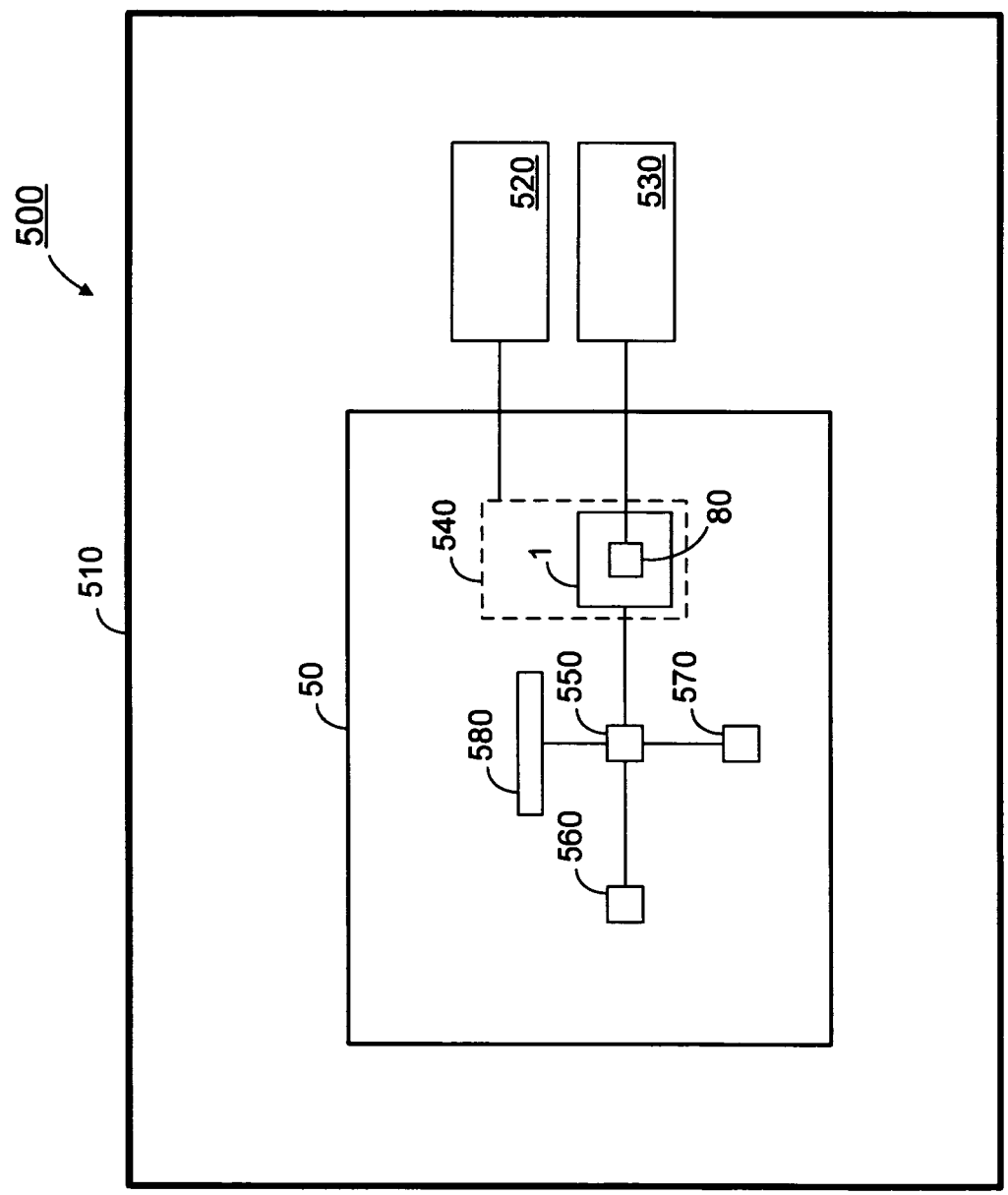
FIG. 5 is a block diagram of a system according to some embodiments.

FIG. 5 is a block diagram of a testing platform according to some embodiments. Testing platform 500 comprises chassis 510, actuator 520, testing device 530, and motherboard 50. Cooling unit 540 is coupled to motherboard 50, and is illustrated as if transparent to reveal contactor 1 and integrated circuit 80 disposed underneath. Also coupled to motherboard 50 and therefore to integrated circuit 80 are controller hub 550, I/O controller 560, Ethernet controller 570, and memory 580. Memory 580 may comprise any type of memory for storing data, such as a Single Data Rate Random Access Memory, a Double Data Rate Random Access Memory, a fully-buffered Dual In-line Memory Module, or a Programmable Read Only Memory. Motherboard 50 may comprise components of a desktop computing platform.

During testing at 402, integrated circuit 80 may be subjected to various environmental conditions while executing instructions received from testing device 530. Testing may include interactions between integrated circuit 80 and other elements of motherboard 50. Cooling unit 540 may cool integrated circuit 80 using any cooling technique, including but not limited to techniques involving liquid coolant. Actuator 520 may move cooling unit 540 to a position that allows cooling unit 540 to cool integrated circuit 80. Flow proceeds to 403 after testing is completed.

At 403, it is determined whether the support has been used for more than a threshold number of testing cycles. One testing cycle may include all desired testing of an integrated circuit placed on the support. In this regard, it may be desirable to replace the support after the support has been used to perform a particular number of testing cycles. Flow proceeds to 404 if the threshold number of testing cycles has not been exceeded.

It is determined if the support is defective at 404. The support may be determined to be defective if it is not suitable for use in testing. Examples of defects according to some embodiments include but are not limited to merging of two or more openings 25, deformation of one or more openings 25, and/or warping of support 20. Defects may cause misalignment of one or more electrical connectors 60 and/or skewing of an interface between support 20 and base 40 or integrated circuit 80. These defects may be caused by manufacturing errors and/or testing conditions such as heat, vibration, and pressure.

If the support is not determined to be defective at 404, the integrated circuit is replaced with another integrated circuit at 405. Replacing integrated circuit 80 may comprise using actuator 520 to move cooling unit 540 to a position away from integrated circuit 80. The new integrated circuit is tested at 402 and flow continues therefrom as described above.

In a case that either of the determinations at 403 or 404 is affirmative, the integrated circuit is removed at 406. Removal of the integrated circuit may be advantageous not only because testing of the integrated circuit may have been completed at 402, but also because removal may allow access to support 20. According to some embodiments of 406, actuator 520 moves cooling unit 540 away from contactor 1. Next, integrated circuit 80 is removed from base 40.

The support is replaced at 407. In some embodiments, base 40 is first removed from contactor 1. Support 20 is then removed from opening 15 of body 10 and replaced with another support. Flow then returns to 401 to receive another integrated circuit and continue as described above. Some embodiments of process 400 therefore allow replacement of support 20 without requiring replacement of body 10.

The several embodiments described herein are solely for the purpose of illustration. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
   a body to couple to a motherboard, the body defining an opening;
   a support removably coupled to the body, the support to mount in the opening;
   a plurality of electrical interconnects disposed in respective ones of a plurality of openings of the support, the plurality of electrical interconnects to electrically couple an integrated circuit to the motherboard; and
   an insert to maintain the plurality of electrical interconnects in the respective ones of the plurality of openings of the support, wherein the insert is to be disposed between the support and the motherboard,
   wherein the support is to pass the plurality of electrical interconnects between the integrated circuit and the motherboard.

2. An apparatus according to claim 1, further comprising:
   a base mounted on the body, the base defining base openings to pass the plurality of electrical interconnects, wherein the base is to receive the integrated circuit and to move toward the support so as to bring electrical contacts of the integrated circuit into contact with the plurality of electrical interconnects.

3. An apparatus according to claim 1, wherein the body comprises ledges extending into the opening, and wherein the support is removably seated on the ledges.

4. An apparatus according to claim 1, wherein the integrated circuit comprises electrical contacts in a Land Grid Array configuration.

5. An apparatus according to claim 1, further comprising:
a cooling unit to cool the integrated circuit using liquid coolant.

6. An apparatus according to claim 5, further comprising:
an actuator to move the cooling unit between a first position for cooling the integrated circuit and a second position for replacing the integrated circuit.

7. A method comprising:
placing an integrated circuit on a support removably coupled to a body coupled to a motherboard, the support mounted in an opening defined by the body and to pass electrical interconnects disposed in respective ones of a plurality of openings of the support to electrically couple the integrated circuit to the motherboard;
testing the integrated circuit;
removing the integrated circuit from the support;
replacing the support with a second support; and
placing a second integrated circuit on the second support.

8. A method according to claim 7, further comprising:
after testing the integrated circuit, moving a cooling unit between a first position at which the cooling unit cools the integrated circuit during testing and a second position that enables removal of the integrated circuit from the support.

9. A method according to claim 7, further comprising:
testing the second integrated circuit.

10. A method according to claim 7, wherein replacing the support comprises:
determining that the support is defective.

11. A system comprising:
a motherboard;
a body coupled to the motherboard, the body defining an opening;
an integrated circuit;
a support removably coupled to the body, the support to mount in the opening;
a plurality of electrical interconnects disposed in respective ones of a plurality of openings of the support, the plurality of electrical interconnects to electrically couple the integrated circuit to the motherboard;
an insert disposed between the support and the motherboard, the insert to maintain the plurality of electrical interconnects in the respective ones of the plurality of openings of the support, and
a double data rate memory electrically coupled to the motherboard and to the integrated circuit,
wherein the support is to pass the plurality of electrical interconnects between the integrated circuit and the motherboard.

12. A system according to claim 11, further comprising:
a base mounted on the body, the base defining base openings to pass the plurality of electrical interconnects,
wherein the base is to receive the integrated circuit and to move toward the support so as to bring electrical contacts of the integrated circuit into contact with the plurality of electrical interconnects.

13. A system according to claim 11, wherein the body comprises ledges extending into the opening, and wherein the support is removably seated on the ledges.

14. A system according to claim 11, further comprising:
a cooling unit to cool the integrated circuit using liquid coolant.

15. A system according to claim 14, further comprising:
an actuator to move the cooling unit between a first position for cooling the integrated circuit and a second position for replacing the integrated circuit.

* * * * *